US006174748B1

United States Patent
Jeon et al.

(10) Patent No.: US 6,174,748 B1
(45) Date of Patent: Jan. 16, 2001

(54) METHOD OF FORMING A TAPERED SECTION IN A SEMICONDUCTOR DEVICE TO PROVIDE FOR REPRODUCIBLE MODE PROFILE OF THE OUTPUT BEAM

(75) Inventors: Heonsu Jeon; Jean-Marc Verdiell, both of Palo Alto, CA (US)

(73) Assignee: SDL, Inc., San Jose, CA (US)

( * ) Notice: Under 35 U.S.C. 154(b), the term of this patent shall be extended for 0 days.

(21) Appl. No.: 09/502,154

(22) Filed: Feb. 11, 2000

Related U.S. Application Data

(62) Division of application No. 08/985,820, filed on Dec. 5, 1997, now Pat. No. 6,052,397.

(51) Int. Cl.[7] .................................................. H01L 21/00
(52) U.S. Cl. .................. 438/31; 438/32; 438/40; 438/41; 438/681; 438/942; 438/700; 372/45
(58) Field of Search .................................. 438/31, 32, 40, 438/41, 680, 681, 942, 700; 372/45

(56) References Cited

U.S. PATENT DOCUMENTS

| 3,978,426 | 8/1976 | Logan et al. ................ 331/94.5 H |
| 4,656,636 | 4/1987 | Amann et al. ........................ 372/50 |
| 5,457,569 | 10/1995 | Liou et al. ............................ 339/344 |
| 5,475,771 | 12/1995 | Hosoi ...................................... 385/11 |
| 5,513,196 | 4/1996 | Bischel et al. ........................ 372/22 |
| 5,574,742 | 11/1996 | Ben-Michael et al. ............... 372/45 |
| 5,574,744 | 11/1996 | Gaw et al. .............................. 385/11 |
| 5,844,929 | 12/1998 | Lealman et al. ....................... 372/45 |
| 5,910,012 | * 6/1999 | Takeuchi ................................ 438/31 |
| 5,933,562 | * 8/1999 | Dutting et al. ....................... 385/131 |
| 5,987,046 | * 11/1999 | Kobayashi et al. ................... 372/45 |
| 6,067,387 | * 5/2000 | Oh et al. ................................. 385/2 |

FOREIGN PATENT DOCUMENTS

| 363233584 | * | 9/1988 | (JP) . |
| 401073689 | * | 3/1989 | (JP) . |
| 401129478 | * | 5/1989 | (JP) . |
| 401321677 | * | 12/1989 | (JP) . |
| 405249331 | * | 9/1993 | (JP) . |

OTHER PUBLICATIONS

T. Brenner et al., "Vertically Tapered InGaAsP/InP Waveguides for Highly Efficient Coupling to Flat–End Single–Mode Fibers", Applied *Physics Letters*, vol. 65(7), pp. 798–800, Aug. 15, 1994.

T. Brenner et al., "Compact InGaAsP/InP Laser Diodes With Integrated Mode Expander for Efficient Coupling to flat–Ended Single Mode Fibres", *Electronics Letters*, vol. 31(17), pp. 1443–1445, Aug. 17, 1995.

T. Brenner et al., "Integrated Optical Modeshape Adapters in InGaAsP/InP for Efficient Fiber–to–Waveguide Coupling," *IEEE Photonics Technology Letters*, vol. 5, No. 9, 1053–1056 (Sep., 1993).

* cited by examiner

*Primary Examiner*—Long Pham
(74) *Attorney, Agent, or Firm*—W. Douglas Carothers, Jr.

(57) ABSTRACT

A method for fabricating a high power laser diode device with an output emission with a nearly circular mode profile for efficient coupling into an optical fiber. A vertical taper waveguide and a window tolerance region are formed in a base structure of the device employing successive etching steps. Further regrowth completes the device structure. The resultant laser device has a vertical and lateral tapered waveguide that adiabatically transforms the highly elliptical mode profile in an active gain section of the device into a substantially circular mode profile in a passive waveguide section of the device.

26 Claims, 10 Drawing Sheets

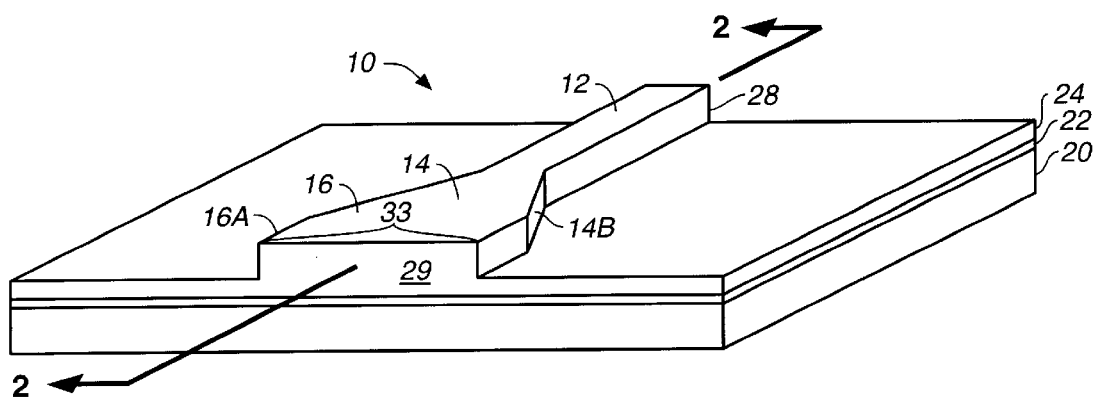
FIG._1
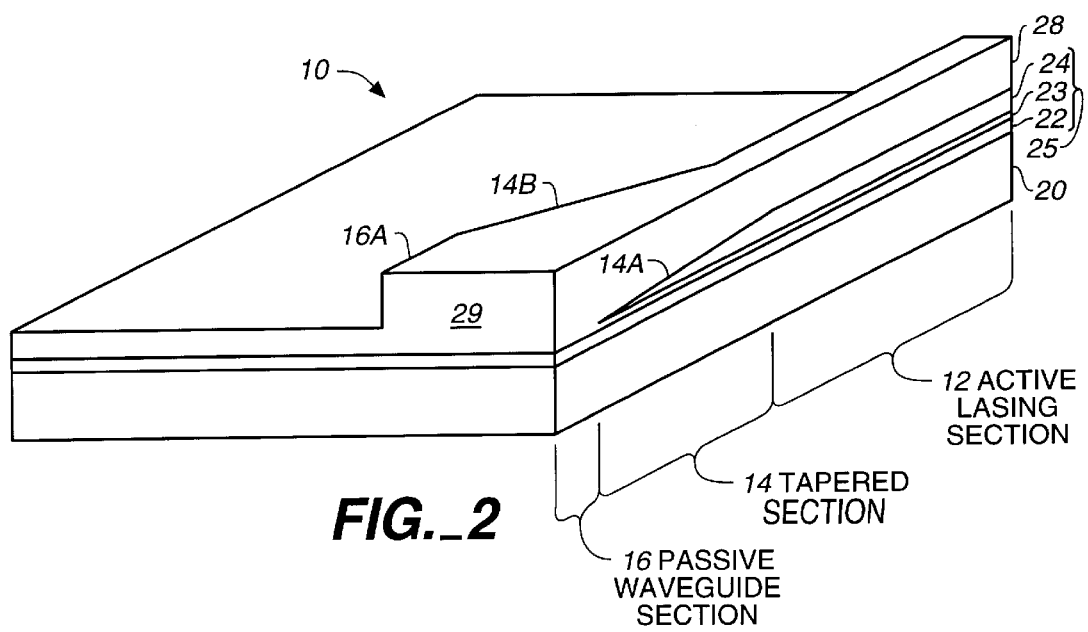
FIG._2

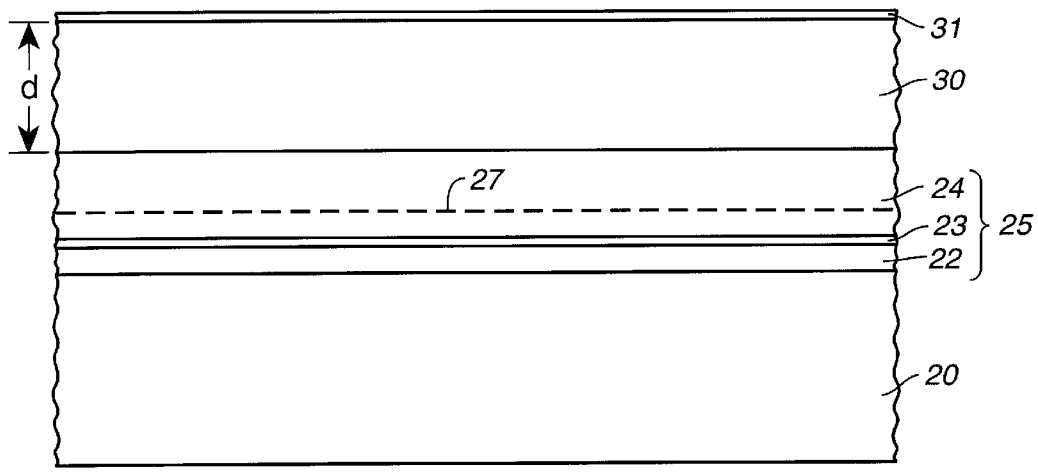
FIG._3A
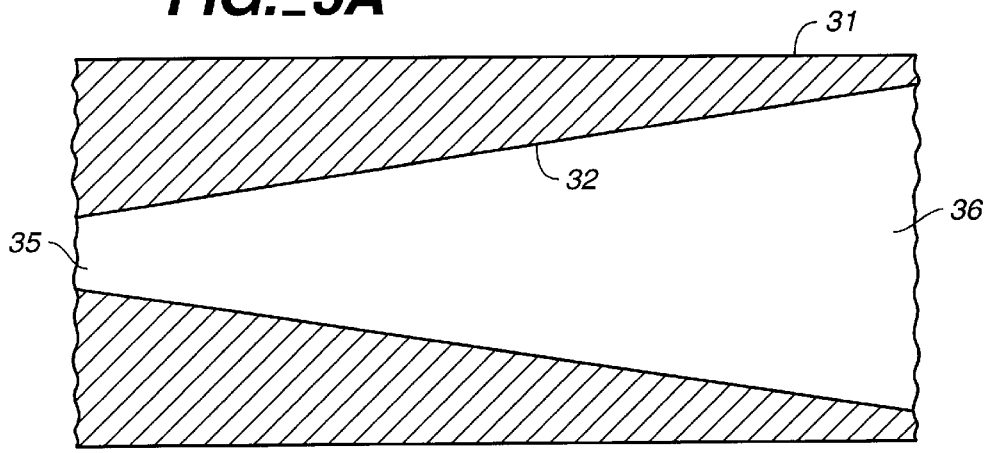
FIG._3B
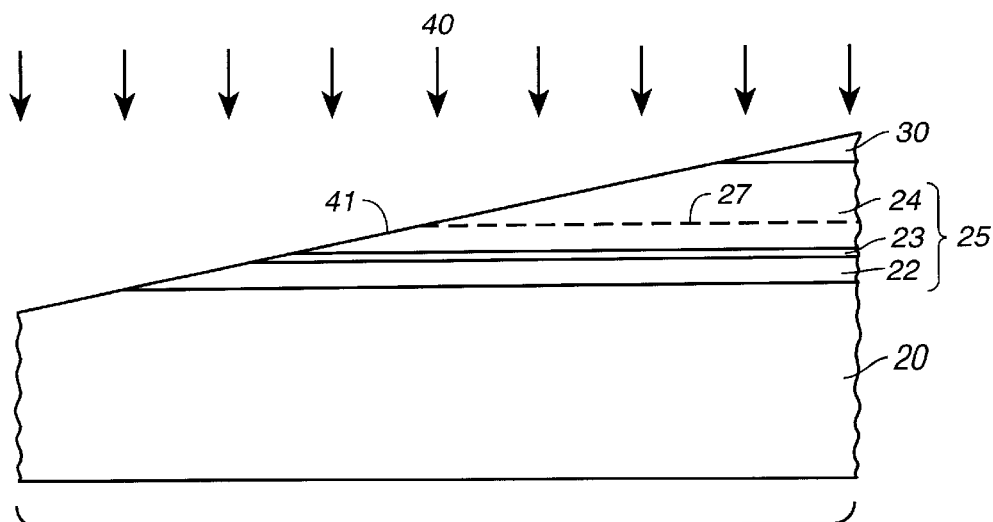
FIG._3C

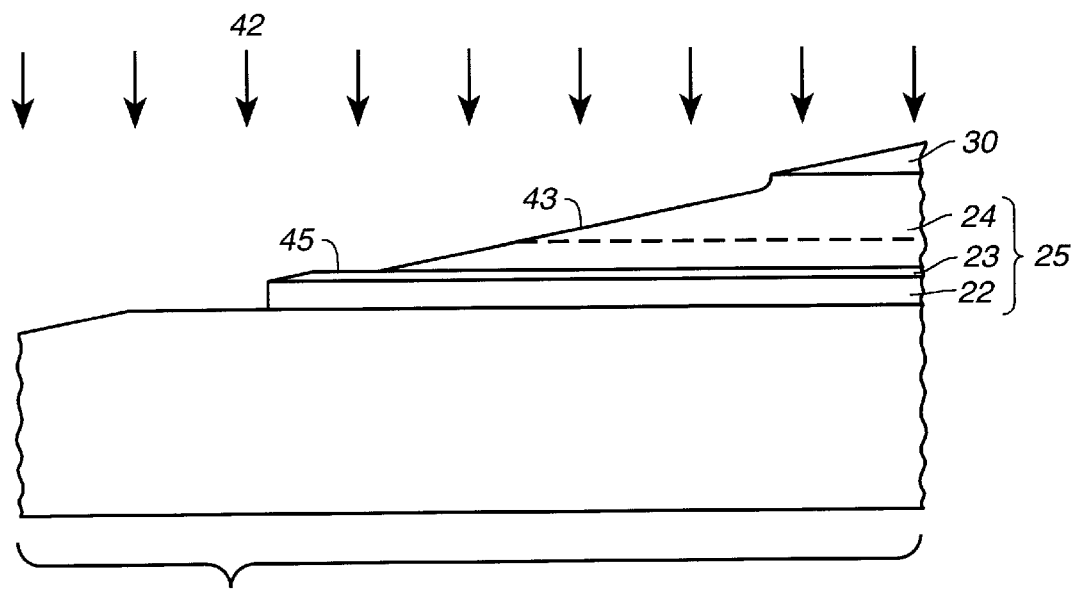
FIG._3D
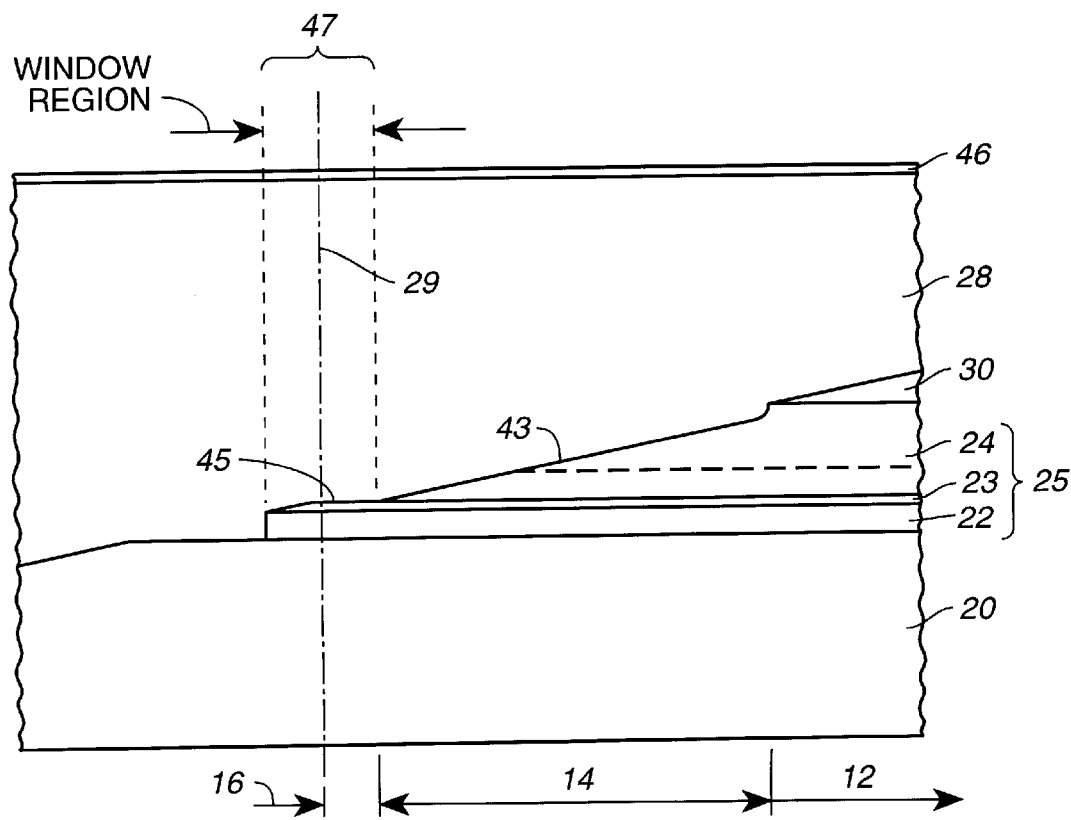
FIG._3E

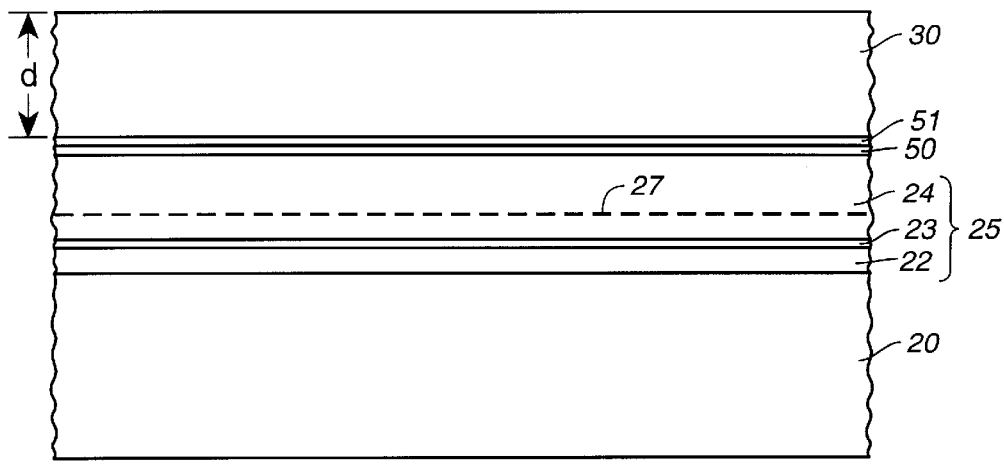
FIG._4A
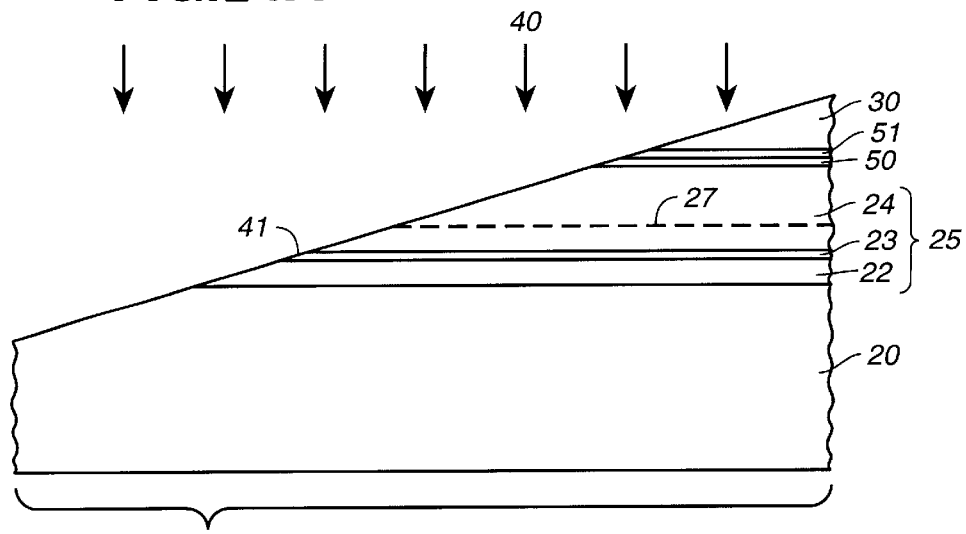
FIG._4B
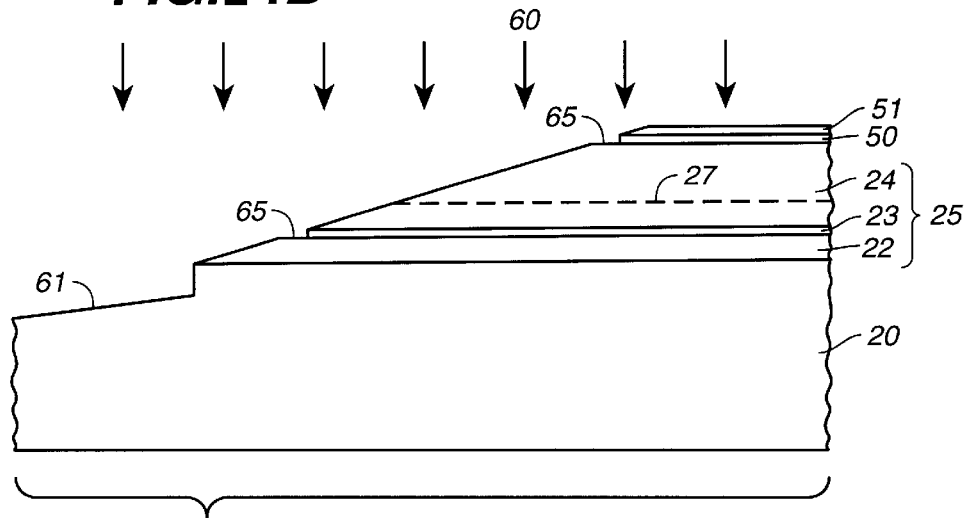
FIG._4C

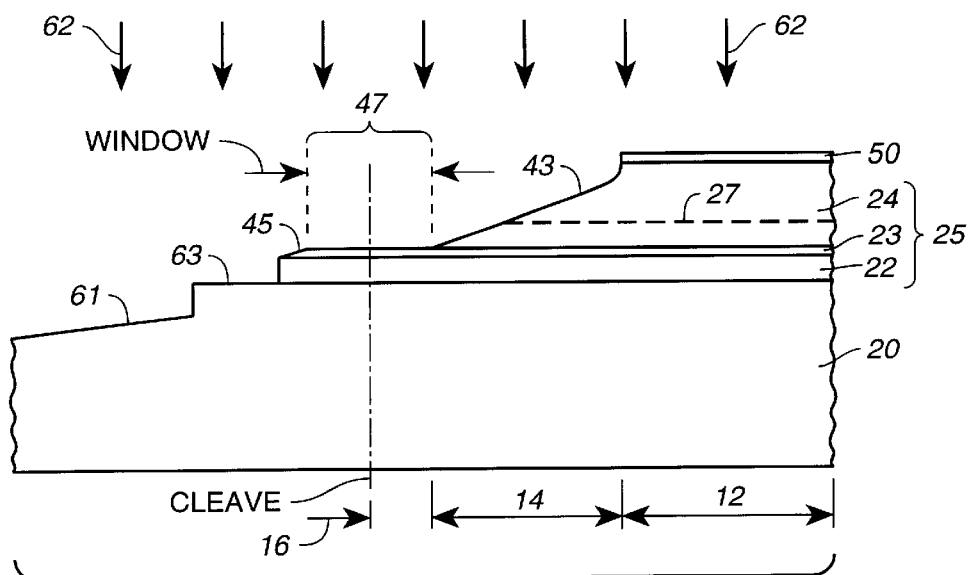
FIG._4D
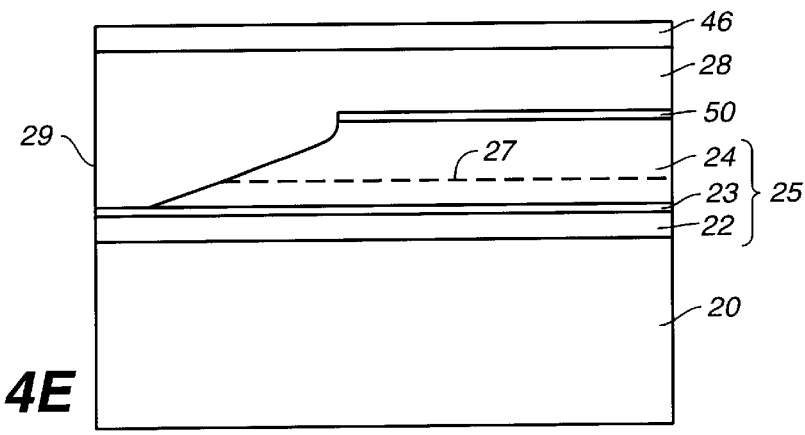
FIG._4E
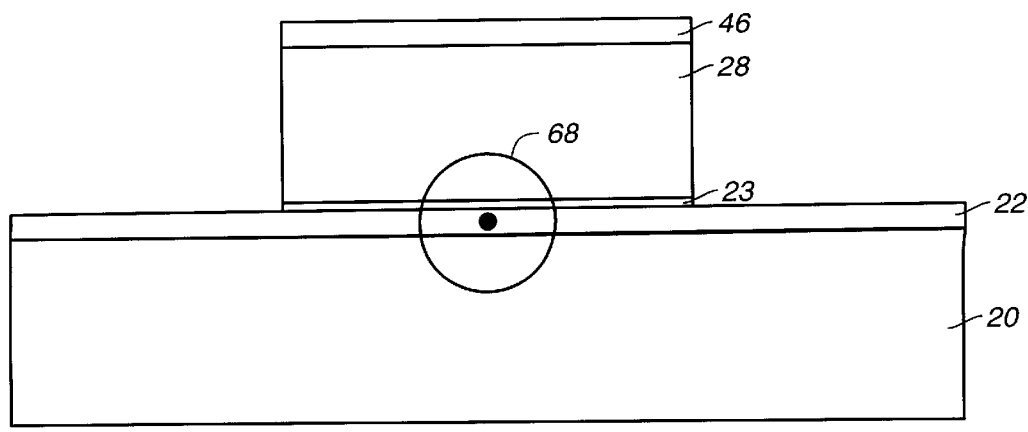
FIG._4F

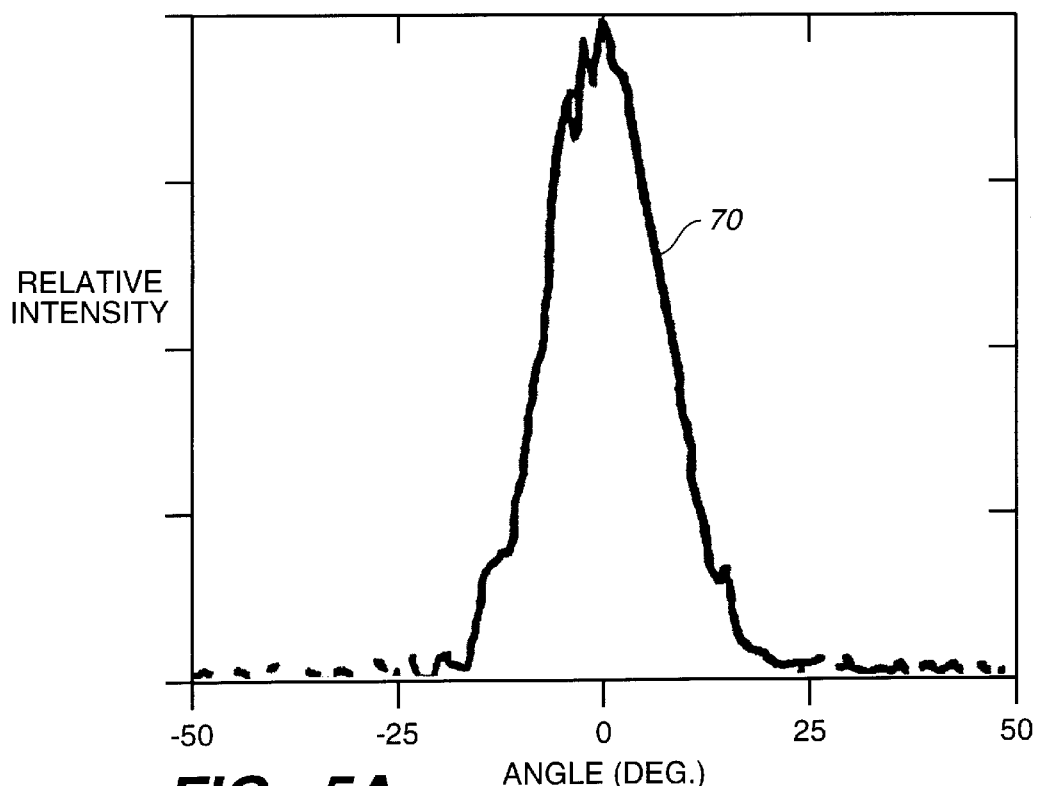
FIG._5A
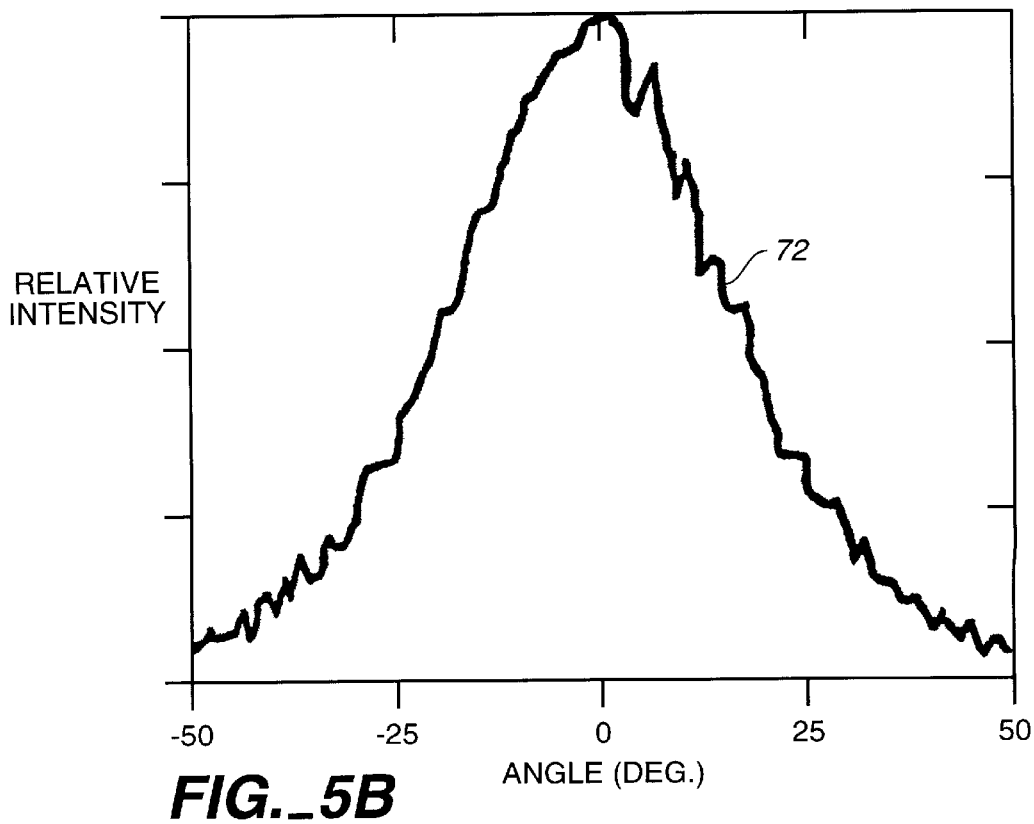
FIG._5B

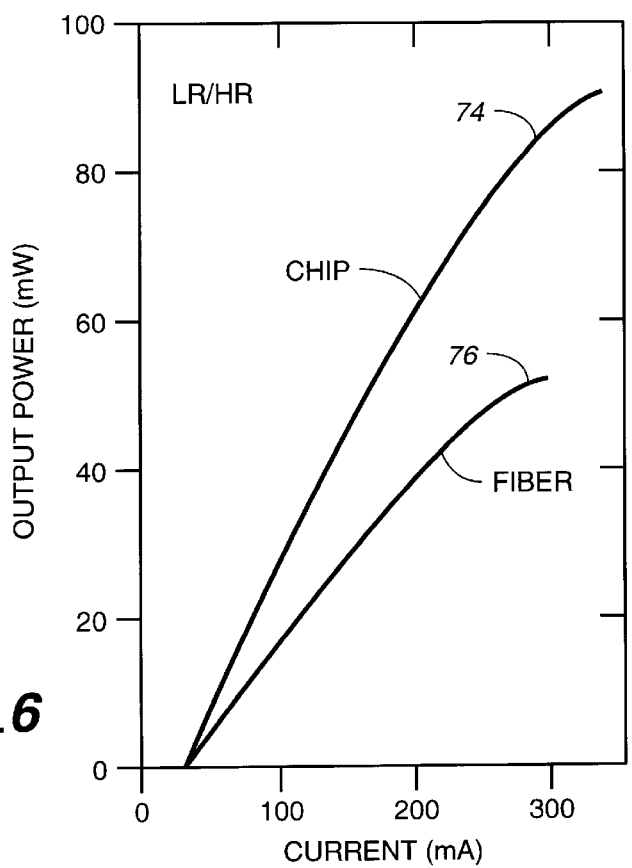
FIG._6
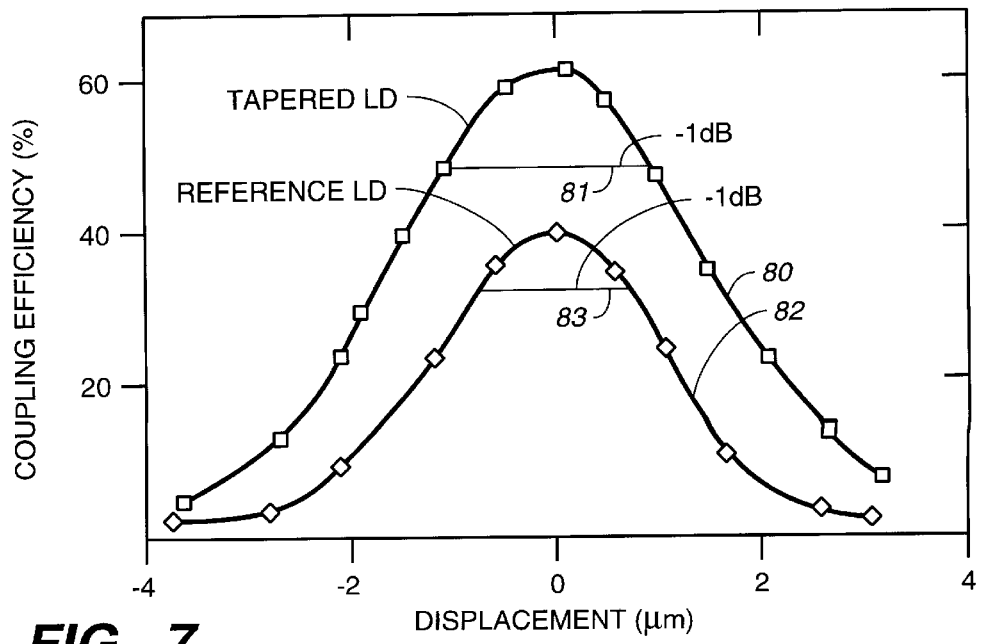
FIG._7

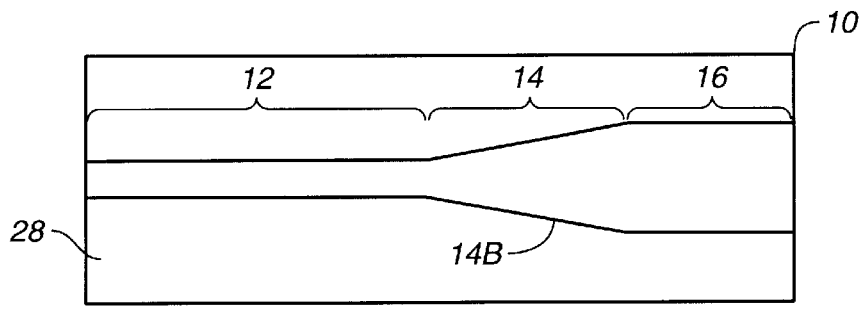
FIG._8A
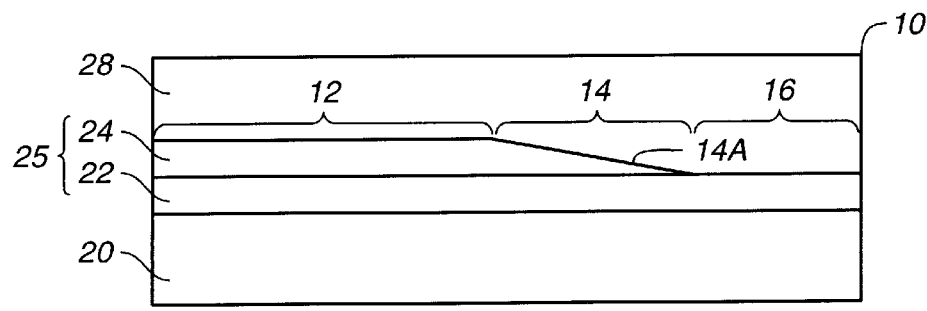
FIG._8B
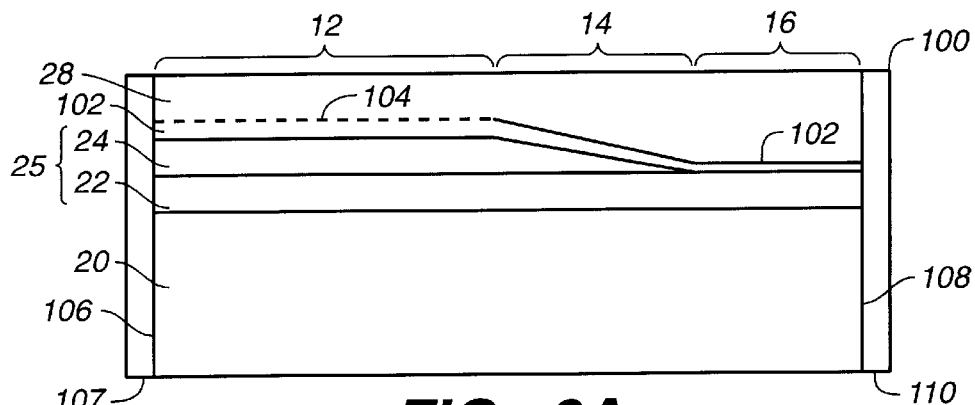
FIG._9A
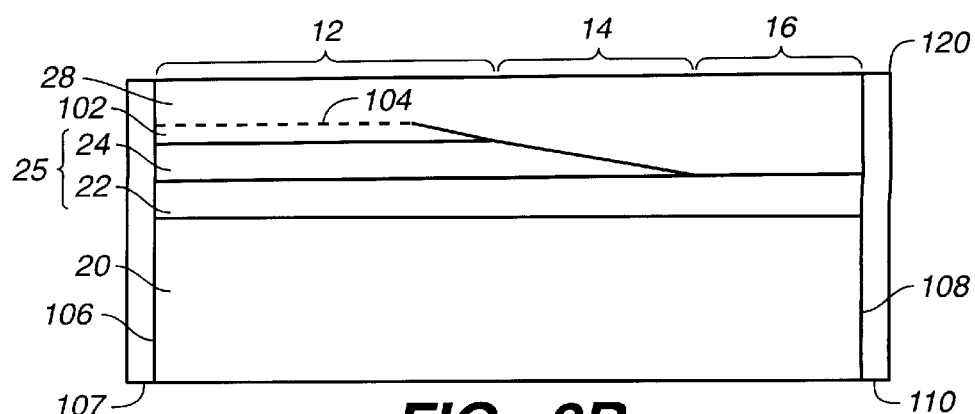
FIG._9B

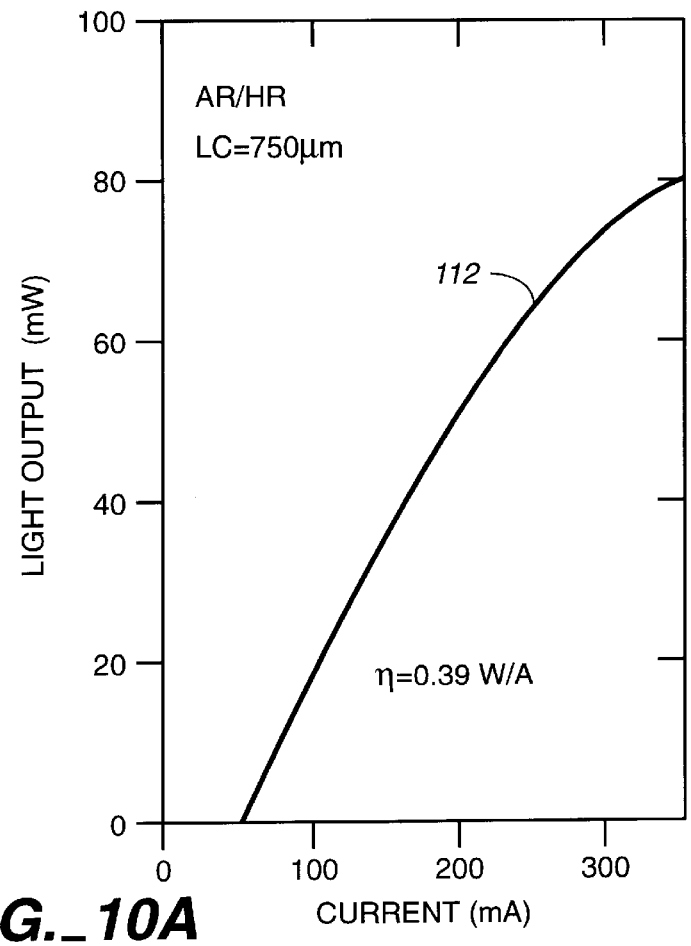
FIG._10A
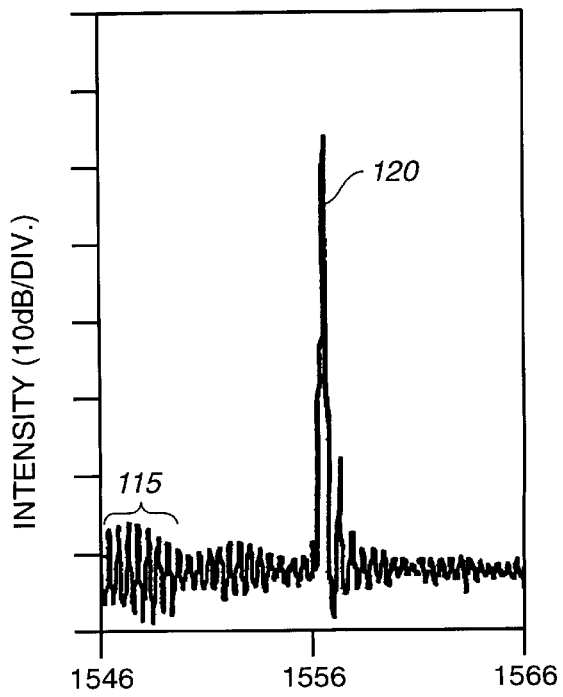
FIG._10B

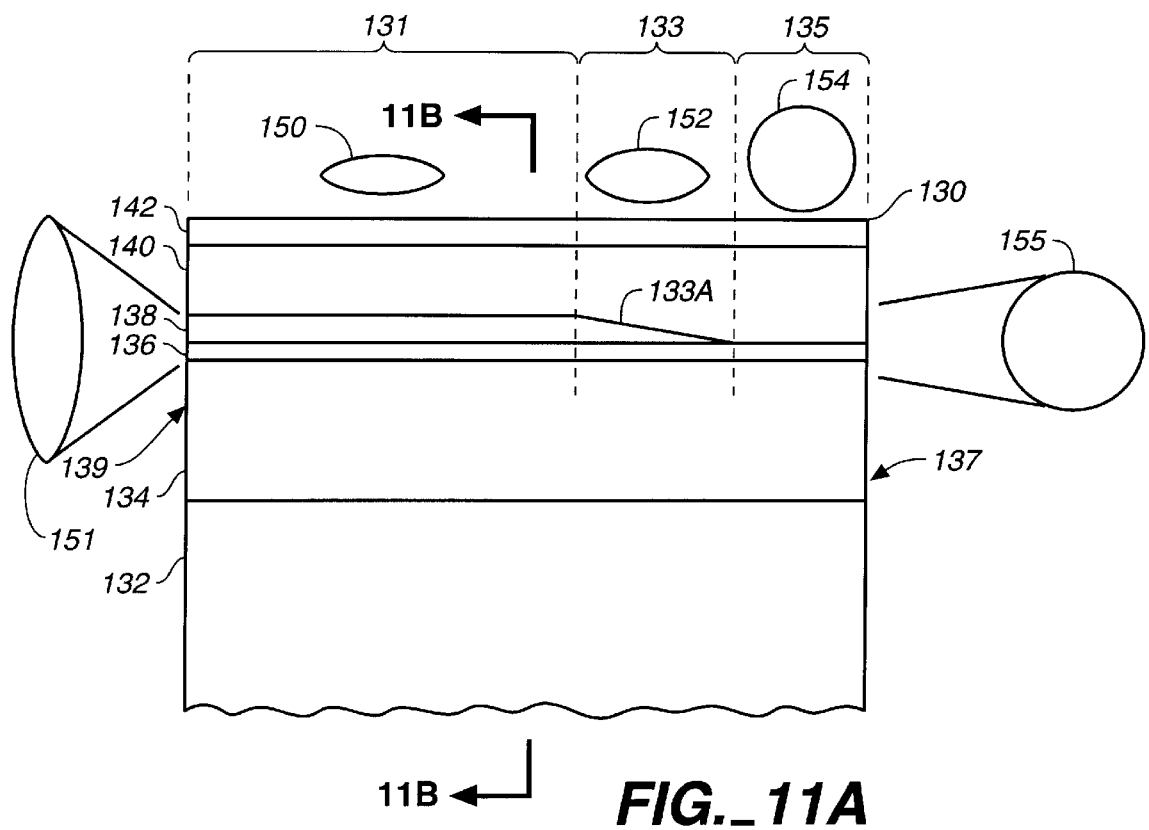
FIG._11A
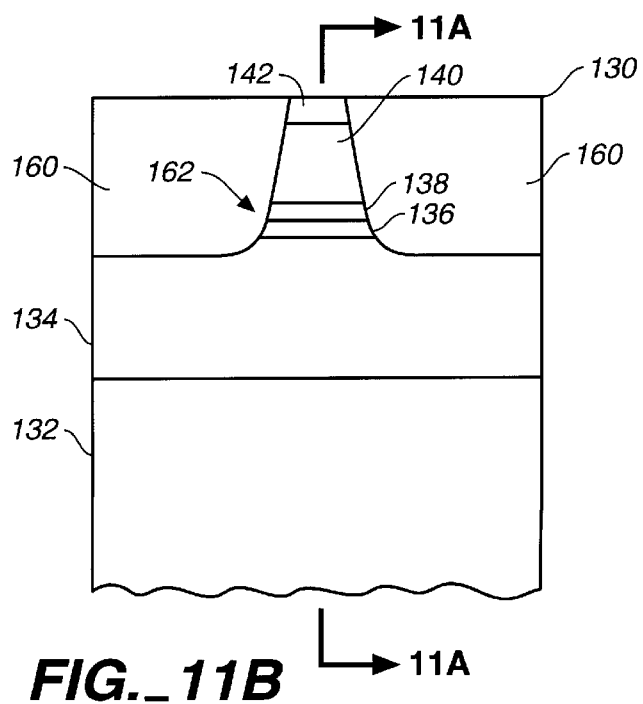
FIG._11B

METHOD OF FORMING A TAPERED SECTION IN A SEMICONDUCTOR DEVICE TO PROVIDE FOR REPRODUCIBLE MODE PROFILE OF THE OUTPUT BEAM

CROSS REFERENCE TO RELATED APPLICATION

This application is a divisional application of application Ser. No. 08/985,820 filed Dec. 5, 1997, now U.S. Pat. No. 6,052,397 which is incorporated herein by its reference.

FEDERALLY SPONSORED RESEARCH AND DEVELOPMENT

This work was supported by Contract No. DAAH01-96-C-R047 funded by the Defense Advance Research Projects Agency. The Government has certain rights in this invention.

BACKGROUND OF THE INVENTION

1. Field of the Invention

This invention relates generally to semiconductor devices and more specifically to a high power semiconductor laser diode with an integrated taper that provides, on a reproducibility basis, for a substantially circular mode profile for efficient coupling thereof to an optical fiber.

2. Background of the Invention

The efficient coupling of light to optical fibers is a critical aspect of many optical communication systems and industries. In particular, low fiber coupling efficiency of laser diodes has been a major limitation for high power single mode fiber output. In a conventional laser diode, optical confinement in the semiconductor structure is asymmetric and the propagating mode profile is elliptical in shape. Also, the mode profile of these high power diode laser sources is reflected in laser beam divergence. The stronger divergence is normally in the vertical or transverse direction due to the strong optical confinement in the vertical direction in the layered semiconductor laser structure, as opposed to the weaker optical confinement in the horizontal or lateral direction.

This highly divergent, elliptical laser diode output beam profile presents a difficulty when attempting to couple the light from a high power laser diode source to a single mode optical fiber. This difficulty is primarily due to the large mode mismatch between the semiconductor laser source and the optical fiber. Thus, a high power laser diode with a circular mode profile and a narrow far-field divergence is particularly desirable for efficient fiber coupling.

Semiconductor waveguide devices have been developed to try to solve this mode-matching problem. These devices have been designed to be either stand-alone passive waveguides or passive waveguides integrated into an active optical source. In particular, several conventional waveguide devices utilize a tapered waveguide region. Briefly, a taper region in a semiconductor waveguide device acts to adiabatically control the expansion of propagating wave and, therefore, the resultant mode-size of the guided optical wave. These tapers may be formed through various techniques. Typically, waveguide devices with lateral tapers are lithographically produced using sub-micron masking and etching procedures as exemplified in U.S. Pat. No. 5,574,742 to Ben-Michael et al. However, it is difficult to precisely control these lithographic processes and the resultant tapers are not easily reproducible. Vertical tapers can be more desirably fabricated using one of several different other techniques. These techniques include selective area growth/etch; shadow mask growth/etch; dip etch; and multiple etch-stop layers. These techniques are briefly described in the article of T. Brenner et al. entitled, "Integrated Optical Modeshape Adapters in InGaAsP/InP for Efficient Fiber-to-Waveguide Coupling," *IEEE Photonics Technology Letters*, Vol. 5, No. 9, 1053–1056 (September, 1993) with reference to other articles or disclosures where the technique is described in particular detail. However, those techniques require extremely high degree of reproducibility in growth etch in order to control the beam divergence as desired. Also, many of the devices fabricated by the conventional techniques in the past suffer from a high degree of optical loss during adiabatic mode conversion. Thus, the light emitted from these conventional tapered waveguide devices can have improved output beam mode quality in terms of divergence, but at the cost of lower optical output power.

What would be more desirable is a simpler and more reproducible structure with highly functional monotonically diminishing vertical taper that provides good expansion characteristic and low optical loss to the propagating beam from the active section to the passive section of the device.

The simplest and easiest method to fabricate a vertical taper so far is the one developed and demonstrated by T. Brenner et al. in the articles entitled, "Vertically Tapered InGaAsP/InP Waveguides for Highly Efficient Coupling to Flat-End Single-Mode Fibers", *Applied Physics Letters*, Vol. 65(7), pp. 798–800, Aug. 15, 1994 and "Compact InGaAsP/InP Laser Diodes With Integrated Mode Expander for Efficient Coupling to flat-Ended Single Mode Fibres", *ELECTRONICS LETTERS*, Vol. 31(17), pp. 1443–1445, Aug. 17, 1995, both of which are incorporated herein by their reference. Here, short in tracavity mode expanders employ concurrent formation of a vertical taper, formed by diffusion-limited etching, and a lithographically formed horizontal waveguide taper to accommodate expanded optical mode. However, the techniques of T. Brenner et al. require high reproducibility in growth/etch rate in order to control the beam divergence in a reproducible manner. Further, a significant difficulty with the proposed structure is that the vertical taper continuously extends so that in order to achieve the desired mode profile, the cleaving of the front end facet position becomes critical relative to the exact point of cleave. Because the dimensions of these devices are in the micron range, it is difficult on a continuous reproducibility basis to form a cleave in a place where the thickness of the waveguide layer will be virtually the same in each case. This is because the reproducibility of the same identical taper from wafer to wafer is difficult to achieve. Therefore, there is no guarantee that the desired mode profile will be exactly the same each time or sufficiently optimized to be substantially circular in extent. Thus, what is need is some built-in mechanism to insure that the mode profile is reproducible by providing a "tolerance window" within which the front facet can be made, resulting in every case the achievement of substantially the same desired mode profile.

Therefore, it is an object of this invention to provide a method of forming an improved tapered waveguide structure that performs adiabatic mode conversion of the elliptical diode laser output into a substantially reproducible circular mode profile.

A further object of this invention is to provide an easier method for fabricating vertical and horizontal waveguide tapers in semiconductor laser devices that provides high reproducibility of the desired mode profile in the output beam from the device.

SUMMARY OF THE INVENTION

The present invention provides a method for a laser diode device having an integrated vertical and horizontal taper waveguide region to adiabatically transform the mode profile from an elliptical mode profile to a substantially circular mode profile on a high reproducibility basis.

According to the method of this invention, a laser diode device includes a base structure comprising a plurality of semiconductor layers that includes a waveguide region consisting of an active waveguide layer and a passive waveguide layer. A passive waveguide layer is formed beneath the active waveguide layer. Between the active and passive waveguide layers is formed a thin etch-stop layer utilized in a second etch step, which is, therefore, a selective etch step. A plurality of etching steps are performed wherein a first step forms a vertical taper contour in a portion of the active waveguide layer and a second step providing a window region of a length within which a cleave can be performed to form a facet upon further completion of the device. The second step may be comprise of more than one etching step.

A first embodiment of the present invention is directed to fabricating a laser diode device with an integrated taper waveguide structure. In a first growth step, a structure is grown that includes a plurality of planar semiconductor layers. This structure comprises a substrate, a first cladding layer formed on the substrate, a waveguide layer, and a second cladding layer, which is employed as an etch-sacrificial layer. The cladding layers are semiconductor materials, such as comprising indium phosphide (InP) layers. The waveguide layer consists of an active waveguide layer that includes multiple quantum wells and a passive waveguide layer that is collinear with the active waveguide layer. The passive waveguide layer has a predetermined thickness relative to the desired expanded mode profile, e.g., that will produce a desired vertical beam divergence angle. These two waveguide layers, for example, may be comprised of indium gallium arsenide phosphide (InGaAsP) layers separated by a thin etch-stop layer, e.g., InP. Next, a separate etch sacrificial layer is deposited on top of the waveguide layer. This sacrificial layer may be comprised of a single layer such as a thick InP layer, or a plurality of layers such as a combination of thin InP and InGaAsP etch-stop layers followed by a thick InP layer.

A plurality of etching steps are performed to form the taper in the active waveguide layer forming part of the waveguide region of the structure. A first non-selective etching step is performed. This step is comprised of a diffusion-limited wet etching process performed on the structure to initiate the formation of a vertical taper using a laterally tapered mask. The tapered mask provides for a narrower width at one end portion compared to the widest width at the other end portion of the mask, e.g., of a substantially trapezoidal shape. The narrower portion will etch faster than the wider portion due to higher availability of etching species in the etchant so that a vertical taper is formed in the waveguide layer beneath the mask.

According to one embodiment of the present invention, the diffusion-limited etching step described above is followed by one or two selective etching steps, depending on the choice of the top sacrificial layer structure. The selective etching process is used to refine the taper-etched structure. The first selective etching step is a InP etch that is needed only for the case with the multiple sacrificial layer structure. This etching removes the remaining portion of the sacrificial InP cladding layer to reveal the top flat InGaAsP etch-stop semiconductor layer. The second selective etching step, a most important step of the two, together with the diffusion-limited taper etching, is a InGaAsP etch that recedes an edge of the tapered active waveguide layer and reveals a flat portion of the passive waveguide layer of the waveguide region beyond the tip of the tapered active waveguide layer, defining a passive waveguide section. Also, during this InGaAsP etch, the InP etch-stop layer between the active and passive waveguide layers protects the underlying passive waveguide layer. For the structure with the top multiple sacrificial layers, this etching step also removes the top InGaAsP semiconductor etch-stop layer, which was used to protect underlying materials during InP etch, and exposes the InP etch-stop layer.

During operation of the device, laser light generated in the active waveguide layer is transferred in a gradual fashion by the integrated taper to the passive waveguide layer and exits the base structure through this portion of the passive waveguide layer beyond the tip of the tapered active waveguide layer. Because the passive waveguide layer has a weaker optical confinement in the vertical direction, the optical mode in the passive section will be enlarged substantially in the vertical direction. In the resultant structure, then, the mode profile will be significantly more circular in shape rather than elliptical.

Next, in a regrowth step, a InP cladding layer is grown over the processed structure. Wafers can then be processed into conventional ridge waveguide laser structures. Laser bars may be cleaved at any point along the exposed portion of the bottom passive waveguide layer without affecting the divergence characteristics of the output beam. Finally, the rear and output facets of the device can be coated with high reflection and partial reflection coatings, respectively.

Ridge waveguide is tapered out in width, i.e., monotonically diverges, to the output facet of the device. Photolithographic techniques are employed to form such a ridge waveguide structure. The lateral taper in ridge waveguide is formed to spatially coincide with the previously processed vertical taper. The purpose of the lateral taper is to accommodate an expanded larger mode caused by adiabatic mode transformation through the formed vertical taper.

The vertical tapered waveguide structure may be incorporated into a distributed feedback (DFB) laser device to achieve a single frequency (or single longitudinal mode) laser output with a circular beam profile. After the diffusion-limited and the two-step selective etching processes are performed, a grating layer is grown and a grating is fabricated in the region of the remaining active waveguide layer. The grating layer may also be grown as part of the base wafer growth, eliminating the necessity of such a regrowth. The position of the grating layer in the deposited layers is placed between the active waveguide layer and the plural etch-stop layers formed on top.

Further features and advantages of the present invention, as well as the structure and operation of various embodiments of the present invention, are described in detail below with reference to the accompanying drawings.

BRIEF DESCRIPTION OF THE DRAWINGS

FIG. 1 is a perspective view of a vertically/laterally tapered device according to this invention.

FIG. 2 is a sectional view of the device shown in FIG. 1 taken along the line 2—2 in FIG. 1.

FIG. 3A is a schematic side view of an asgrown laser diode device, including a sacrificial layer, according to a first embodiment in the practice of the method according to the present invention.

FIG. 3B is a plan view of the mask formed in a mask layer formed on the sacrificial layer of FIG. 3A.

FIG. 3C is a schematic side view of first etching step according to the practice of method of this invention relative to the first embodiment.

FIG. 3D is a schematic side view of second etching step according to the practice of method of this invention relative to the first embodiment.

FIG. 3E is a schematic side view of the formation of the second growth according to the practice of method of this invention relative to the first embodiment.

FIG. 4A a schematic side view of an asgrown laser device, including a sacrificial layer, according to a second embodiment in the practice of the method according to the present invention.

FIG. 4B is a schematic side view of first etching step according to the practice of method of this invention relative to the second embodiment.

FIG. 4C is a schematic side view of second etching step according to the practice of method of this invention relative to the second embodiment.

FIG. 4D is a schematic side view of third etching step according to the practice of method of this invention relative to the second embodiment.

FIG. 4E is a schematic side view of the formation of the second growth and device front facet cleaving according to the practice of the method of this invention relative to the second embodiment.

FIG. 4F is a schematic front view of the device shown in FIG. 4E.

FIG. 5A is a far-field beam profile of a tapered waveguide laser device according to the present invention and FIG. 5B is a far-field beam profile of a non-tapered laser device known in the art.

FIG. 6 illustrates power output versus current characteristic for a tapered laser device according to the present invention.

FIG. 7 compares the vertical displacement sensitivity in coupling for both a tapered and a non-tapered laser diode device to an optical fiber.

FIG. 8A is a schematic plan view of laser diode device according to the present invention.

FIG. 8B is a schematic side view of laser diode device shown in FIG. 8A.

FIG. 9A is a schematic diagram of a distributed feedback (DFB) laser diode device according to one practice approach of this invention.

FIG. 9B is a schematic diagram of a distributed feedback (DFB) laser diode device according to another practice approach of this invention.

FIG. 10A is a graphic representation of the light output versus current characteristics for the laser diode device of FIG. 9.

FIG. 10B is a graphic representation of the intensity versus output frequency for the laser diode device of FIG. 9.

FIG. 11A is a lateral cross sectional view taken along the line 11A—11A of FIG. 11B of another embodiment of a tapered laser diode device according to this invention.

FIG. 11B is a longitudinal cross sectional view taken along the line 11B—11B of FIG. 11A of another embodiment of a tapered laser diode device according to this invention.

DETAILED DESCRIPTION OF THE EMBODIMENTS

The present invention is directed toward a high power laser diode device with a designed mode profile that is capable of being efficiently coupled into an optical fiber. Further embodiments of the present invention include a distributed feedback (DFB) laser source. These further embodiments are used to achieve single-frequency output. For simplicity, invention is described relative to a single device structure although in product multiple devices would be produced with respect to a single semiconductor wafer. The manner in which this is accomplished is now described.

Reference is now made to FIG. 1 which shows a perspective view of a semiconductor device 10 according to the present invention. Device 10 may be a semiconductor laser structure or other active medium device where generated light occurring under lasing conditions is formed in an active lasing section 12, propagates through a tapered section 14 where the propagating mode then undergoes expansion and transformation in passive waveguide section 16. The mode, upon entering into passive waveguide section 16, is transformed into a substantially circular one due to the preformed cross sectional geometry of the passive waveguide section. The cross sectional configuration of FIG. 2 shows in more detail the geometry of the layers comprising sections 12, 14, and 16. As an example of the implementation of device 10, tapered section 14 for permitting gradual mode expansion may be in the range, for example, of about 50 $\mu$m to about 150 $\mu$m while the total device length may be in the range, for example, of about 500 $\mu$m to 1000 $\mu$m.

The geometry shown in FIGS. 1 and 2 of this application is similar in appearance to the structure, for example, shown in FIG. 1 of the article of T. Brenner et al. entitled, "Compact InGaAsP/InP Laser Diodes With Integrated mode Expander for Efficient Coupling to Flat-Ended Single Mode Fibres", *ELECTRONIC LETTERS*, Vol. 31(17), pp. 1443–1445, Aug. 17, 1995. In the structure shown in FIG. 1 of this article, there is illustrated a vertically tapered active waveguide region that permits mode expansion into an upper laterally tapered passive waveguide structure. However, two important features of this invention are: First, the provision in waveguide region 25 of what we refer to as a backbone layer 22 as part of main, active waveguide layer 24. The thickness of backbone layer 22 is primary in the determination of the final mode profile and, therefore, is one of the contributing factors of high reproducibility on a continuous basis of the desired mode shape output. Layer 22 is of similar material to main waveguide layer 24 that includes optically active materials, e.g., a plurality of quantum wells, and forms the geometrical foundation for the desired expanded mode profile. Waveguide region 25 is illustrated here as two layers, backbone passive waveguide layer 22 and active waveguide layer 24. However, other combinations of waveguide layers may be employed or additional waveguide layers may be utilized. Second, the use of a further selective etch step, following the initial taper formation, to further refine the taper of tapered section 14 providing what we refer to as a window region through which subsequent cleaving can be performed anywhere within the window region to form the front facet of a device. The selective etch step is performed along a region of taper 14A that includes backbone layer 22 rendering the cross section geometry of this region of the taper substantially the same, that is, the selective etch step results in a forward portion of the tapered region to be of uniform thickness resulting in the desired mode profile for the propagating light to be achieved no matter where the location of the cleave is performed in the formed window region.

In FIGS. 1 and 2, the fully processed semiconductor device 10 is illustrated without the semiconductor substrate shown. The semiconductor device 10 may be comprised of the material system df InGaAsP/InP and may be formed employing MOCVD as is known in the art. In Device 10, as is known in the art, lower cladding layer 20 may be InP followed by waveguide structure 25 which comprises two InGaAsP waveguide layers 22 and 24 with an intervening etch-stop layer 23 comprising InP. While layers 22 and 24 are exemplified here as InGaAsP layers, other Group III-V layers may be utilized as is known to those skilled in the art. Lower layer 22 is smaller in thickness than upper layer 24 and the latter includes an active region 27, shown in FIG. 3A, which may be comprised of a single active layer or quantum well layer or a plurality of quantum well layers separated by barrier layers. On the top of upper waveguide layer 24 is the upper In P cladding layer 28 deposited in the second growth operation after the completion of the etching processing. Removed during the taper etch are a pair of etch sacrificial layers consisting of a thick InP layer and/or a thin InGaAsP layer, which are not seen in FIG. 1 and 2. As seen best in FIG. 2, semiconductor laser device 10 comprises two orthogonal tapers, a vertical or transverse taper of waveguide structure 25 at 14A and a horizontal or lateral taper 14B via upper cladding layer 28 which expands laterally toward front facet 29.

Reference is now made to the first embodiment of this invention, illustrated in FIGS. 3A–3D. In the starting base wafer structure, core waveguide structure 25 comprises two waveguide layers 22 and 24, upper layer 24 including an optically active region 27 and lower layer 22 forming a passive waveguide layer. These layers 22 and 24 are separated by a thin InP etch-stop layer 23, e.g., approximately only 200 thick. Etch-stop layer 23, being so thin, has no significant detrimental effect to the waveguide properties of the higher index materials comprising layers 22 and 24. Lastly, a sacrificial layer 30 comprising InP is grown on the top of waveguide structure 25. An important factor in achieving the desired mode profile is the determination of the thickness of lower passive waveguide layer 22. Since, as will be described later, layer 22 is left intact via the etching process due to the InP etch-stop layer 23, the resultant expanded profile can be calculated based upon the initial growth thickness established for passive waveguide layer 22.

The described structure above undergoes two successive etching steps comprising a first etching step for the initial vertical taper formation and second etching step that exposes the underlying layers 22 and 23 in a controllable manner which also refines the vertical taper formed in the first step. Thus, what results in the end is the formation of a passive waveguide section 16 with the exposure of a portion of passive waveguide layer 22 with its etch-stop overlayer 23 which, in combination with second growth cladding layer 28 forms a three dimensional waveguide structure into which the mode may expand from active section 12 with a desired mode profile.

The etching process begins with the first non-selective etching step via a mask, in particular, a diffusion-limited etching step. Diffusion-limited etching is characterized by the non-selective material removal, but at an etch rate governed by the availability of etching species in the etchant. In preparation for etching, a dielectric mask layer 31 deposited on the base wafer structure as shown in FIG. 3A. Dielectric layer 31 may be, for example, around 100 nm to 200 mn thick layer of $SiO_2$ or $Si_3N_4$. Layer 31 is provided with an etched opening 32 that has the appearance as shown in FIG. 3B which has a trapezoidal shape with a smaller width end 34 and a larger width end 36. Opening 32 may, for example, have a width at end 36 of about 250 µm and monotonically diminishing to a smaller width 34 of about 50 µm over a length, for example, in the range of about 100 µm to about 250 µm depending on the desired rate of vertical taper profile 14A (FIG. 2). Because of the tapered shape of the mask window, when the etchant is applied to the window region, the narrower width portion 34 of window. 32 will etch at a faster rate than wider width portion 36 since there are more etching species available per unit area to be etched. As a result, a gradually vertical taper 41, as shown in FIG. 3C, is formed due to the laterally tapered mask pattern 32. This taper formation process is called a diffusion-limited etching technique in which the etching rate is controlled by the availability of etchant species per unit area. The etchant used must be able to etch all Group Ill-V materials present, i.e., InGaAsP and InP as depicted in FIG. 3C where etchant 40 is applied via mask 32 resulting in a diagonally etched surface 41 as shown. This etching step may take several tens of minutes, depending on the strength of the etchant employed and the desired height contrast in the processed taper 14A. Relative to the Group III-V materials employed, a conventional $Br_2$-based etchant may be employed. To achieve the desired taper profile 41, the thickness, d, of sacrificial layer 30 needs to be selected within the tolerance range for the given minimum and maximum etching rates as determined by mask opening 32 as well as the required thickness of the layers through which the vertical taper profile 41 has to be formed. The optimal thickness, $d^{sac}$, of the sacrificial layer 30 can be determined using the following relationship:

$$r_{min} \cdot t < d^{sac} < r_{max} \cdot t - d^{taper}$$

where $r_{min}$ and $r_{max}$ are the minimum and maximum etch rates along the taper direction, t is total etching duration time, $d^{taper}$ is the total thickness of the layers through which a vertical taper is to be formed, i.e., layers 22, 23 and 24 comprising waveguide structure or region 25. The maximum etch rate (rmax) occurs at end 34 of mask 31 and the minimum etch rate ($r_{min}$) occurs at end 36 of mask 31. Within the above range for '$d^{sac}$, a part of sacrificial layer 30 remains over top of active waveguide section 12 and prevents the unwanted removal of portions of active waveguide layer 24 in the active region during the successive selective etch step.

Next, as illustrated in FIG. 3D, a second selective etch step is performed for etching the InGaAsP layer using, for example, a $H_2SO_4/H_2O_2$-based etchant. During this etch, the selective etch 42 removes the tapered portion of InGaAsP layer 24 while the remaining InP sacrificial layer 30 in active section 12 functions as a stop-etch to protect the underlying waveguide structure. As the etching process proceeds, upper waveguide layer taper recedes at 43 progressively opening up or exposing underlying passive waveguide layer 22 at 45, which is not yet directly exposed to the etchant due to the etch-stop layer 23. The time for this etching process may be tens of seconds, such as from 10 seconds to 30 seconds in length, depending on the length of the open area 45. Thus, this second etching step provides the finctions of fine tuning the vertical taper profile while exposing a length 45 of underlying passive waveguide layer 22. This exposed portion 45 has a predetermined waveguide layer thickness that is characteristic of the desired mode profile relative to forming a vertical mode expander. Any remaining portion of mask 31 may be removed by means of hydrofluoric acid for $SiO_2$ or $CF_4$ plasma for SiN.

After the foregoing etching processing, a regrowth process is initiated comprising upper cladding layer 28 of InP followed by contact layer 46 of InGaAs as illustrated in FIG. 3E. This completes the device structure and the formation of the vertical taper structure comprising this invention. As illustrated in FIG. 3E, the selective etch step with thin layer 23 functioning as an etch-stop layer, produces a flat portion 47 of uniform thickness through which a cleave may be performed to form the front facet 29 of the device. Portion 47 provides a window region through which the cleave can be accomplished without error as to resulting thickness achieved for passive waveguide section 16 and, therefore, reproducibility of the mode profile can be assured by the establishment of window region 47. Thus, an important factor in achieving the desired mode profile is the determination of the thickness of lower passive waveguide layer 22. Since a portion of layer 22 at 45 is left intact via the etching process due to the InP etch-stop layer 23, the resultant expanded profile can be calculated based upon the initial growth thickness established for passive waveguide layer 22.

A ridge waveguide structure may then be formed, as is known in the art using conventional lithography and etching techniques resulting in the device geometry, shown in FIG. 1, forming the lateral taper or lateral mode expander portion 14B. As best seen in FIG. 2, lateral taper 14B is coincident with vertical taper 14A in tapered section 14. Lateral taper 14B accommodates the simultaneous expansion of the propagating mode in the lateral direction caused by the primary expansion of the propagating mode in the vertical direction due to the monotonic diminishing taper of active waveguide layer 24.

An important feature of this invention is that the exposed portion 45 provides a uniform exposed region of the predefined passive waveguide layer 22 that controls mode expansion in a predetermined manner forming a window region within length 45 wherein a cleave for front facet 29 can be made without any concern as to the accuracy of achieving the Correct cleave point since any point along this etched length 45 will produce the desired results.

Reference is now made to the second embodiment of this invention, illustrated in FIGS. 4A–4F which provides for more refined control and reproducibility in the taper etch processing. Instead of a single sacrificial layer 30, in this embodiment a stack of sacrificial layers is employed, for example, a thin etch-stop layer 50 of InP followed by an InGaAsP etch-stop layer 51 which is followed by relatively thick InP sacrificial layer 30. Using this thicker etch-stop layer group 50, 51, a clean surface termination can be achieved after completion of the taper etch step with no remaining sacrificial layer 30. The stack stop-etch layers provide a way to form a more uniform waveguide in active waveguide section 12 as will be evident in the following description.

In the etching process of this second embodiment, the first non-selective etching step, the results of which are best seen in FIG. 4B, is identical to that of the previous embodiment. A $Br_2$-based etchant 40 is employed to perform a diffusion-limited etching with mask 30 having mask opening 32. As a result, a vertical taper 41 is formed as shown in FIG. 4B. As indicated previously, to achieve the desired taper profile 41, the thickness, d, of sacrificial layer 30 is selected to have a value between the minimum and maximum etching rates and time of the etchant employed, as determined by mask opening 32, as well as taking into consideration the required thickness of the layers through which the vertical taper profile 41 has to be formed in relation to the maximum etching rate and time at mask portion 34.

This first non-selective etch step is then followed by two selective etch steps rather than one such step as in the case of the first embodiment. In the previous embodiment, a selective etch of InGaAsP layer 24 is performed. In this embodiment, a first selective etch 60 is performed to remove the remaining portions of InP sacrificial layer 30 from active waveguide section 12. The etchant used is one known for InP, which is a HCl-based etchant. The resulting structure after performing this etching step is shown in FIG. 4C. Since this etchant also is effective on the InP cladding layer 20, a large step 61 is formed at the tip 63 of waveguide region 25 as shown in FIG. 4C. Step 61 is highly useful as an eye-mark for seeking the initial position of the window region for cleaving the front facet of the device. Also, as noted in FIG. 4C, other etched nitches 65 are formed in etch-stop layers 23 and 50. Between nitches 65, a vertical taper is formed in waveguide layer 24.

Next, as shown in FIG. 4D, a second selective etch 62 is performed comprising a sulfuric acid-based etchant for InGaAsP waveguide layer 24 as in the case of the selective etching step in the first embodiment. As can be seen in FIG. 4D, selective etch 62 causes a receding of taper of waveguide structure 25 well beyond its original point in FIG. 4C forming A well defined, extended length of passive waveguide 22 of uniform thickness which we identify as window region 47. Of importance to note in FIG. 4D is that window region 47 provides an extended area within which to perform a cleave along a length of passive waveguide layer 22 which is of uniform thickness so that the originally programmed thickness of passive waveguide layer 22, which is calculated for providing the desired resultant mode profile, is retained within an extended area where the cleave point can be made anywhere along window length. Thus, the chance for cleaving into the taper of waveguide structure 25 is substantially eliminated and the location of window region 47 is easily ascertained via eye-mark step 63. This provides for higher yields of accurately defined, substantially circular mode profiles without any possibility of the inclusion of any portion of waveguide region of taper 14A of waveguide structure 25.

Next, the regrowth steps are performed comprising the deposition of upper cladding layer 28 of InP followed by contact layer 46 of InGaAs, as illustrated in FIGS. 4E and 4F. Then, wafers are processed into ridge waveguide laser diode structures and the cleaving step is performed forming front facet 29, as shown in FIG. 4E, the cleave being made in any location within window region 47. Metal contacting is accomplished as is well known in the art. The resultant mode profile is substantially circular, as shown at 68 in FIG. 4F.

In the conventional taper device as shown in the T. Brenner articles, as best seen in side elevation in FIG. 1 of T. Brenner et al., entitled, "Integrated Optical Modeshape Adapters in InGaAsP/InP for Efficient Fiber-to-Waveguide Coupling," *IEEE Photonics Technical Letters*, Vol. 5, No. 9, 1053–1056 (September, 1993), The optical mode size is ambiguously defined because the cleave made in the front facet exists in the taper, as seen in FIG. 1 thereof, whereas, in the embodiments of the invention, a window region 47 is designed to have a uniform thickness profile that extends or forms into the passive waveguide section. This window region provides a region of tolerance along the length of which a cleave can be made without error since the thickness of backbone layer 22 predetermines the resultant mode profile. Also, good mode profile control is achieved providing a backbone passive waveguide layer 22 which is part of passive waveguide section 16 and has a thickness that will predictably determine the resultant mode profile. Such a base mode predicting layer is not utilized in T. Brenner et al.

We have performed tens of taper processing according to this non-selective/selective etch method resulting in good reproducibility of the same mode profile with taper formation control. As an example, a 1.55 μm multiple quantum well (MQW) laser diode with a built-in vertical mode expander was fabricated according to the second embodiment above with the same material regime, and exhibited high single mode output power in a nearly circular far-field beam pattern. The output beam characteristics of the laser diode device are compared to a reference laser diode that did not contain a vertical taper is shown in FIGS. 5A and 5B. FIG. 5A illustrates the vertical far-field pattern 70 of a tapered device and FIG. 5B illustrates the vertical far-field pattern 72 of a reference, no-taper laser fabricated from a wafer with similar layer structure. The vertical divergence angle at FWHM of the output beam of the tapered laser diode device was 16°. This divergence angle represents a significant reduction from the 40° divergence angle in the vertical direction of the output beam of the reference laser. Far-field patterns in the lateral direction were similar for both types of devices with the FWHM being about 12°–16°, depending on the width 33 of the ridge at output facet 29 as shown in FIG. 1.

FIG. 6 illustrates the light output versus input current of a 750 μm long tapered laser device formed according to the second embodiment of this invention. Curve 74 shows that the laser output power characteristic for a taper InGaAsP/InP laser diode device 10 comprising this invention exceeded 90 mW in continuous-wave (CW) operation, with a drive current of approximately 320 mA. This electrical-to-optical efficiency or slope efficiency curve is very similar to that of a standard, non-tapered diode laser device. For example, a conventional laser diode device of similar length, but without an integrated vertically tapered waveguide structure of this invention, operates with an electrical-optical conversion efficiency of approximately 0.4 Watts/Amp. The laser diode device of this invention has been determined to operate with an electrical-to-optical conversion efficiency of approximately 0.36 Watts/Amp. Moreover, integrating the vertically tapered waveguide region into the laser diode device does not substantially increase laser threshold.

Therefore, curve 74 illustrates that the tapered waveguide section of tapered laser diode device 10 provides a smooth gradual taper to minimize optical output power losses. Tapered device 10 was also coupled to a lensed single mode fiber. The output power emitted from the fiber as a function of driving current is also shown in FIG. 6 as curve 76.

The results of a preliminary fiber coupling demonstrated 63% coupling efficiency into a lensed single mode fiber. The spatial fiber misalignment tolerance in the vertical direction of tapered laser diode 10 was compared to a non-tapered laser diode and the results are shown in FIG. 7. A maximum coupling efficiency of 63% (approximately −2 dB in loss) of tapered device 10 was achieved with a relaxed alignment tolerance indicated at 81 of curve 80 of approximately ±1 μm. The coupling efficiency of a non-tapered device was compared which had a maximum coupling efficiency of 40% (approximately −4 dB in loss) with a tighter alignment tolerance indicated at 83 of curve 82 of approximately ±0.5 μm. Thus, a laser diode device 10 with an integrated, tapered waveguide section according to the present invention represents a substantial improvement in coupling efficiency as well as alignment tolerance when coupled into an optical fiber as compared to a standard, non-tapered laser device.

Although the above description refers to laser diode devices operating in the 1.5 μm wavelength region, the present invention can be implemented in other laser structures. Of course, base structures with different semiconductor material layers for laser operation in different wavelength regions can require different non-selective and selective etching mediums but the process would be carried out in the same manner. In addition, regrowth techniques can depend on the semiconductor material layers used and whether chemical reactions such as oxidation can occur. These modified processes will be apparent to those skilled in the relevant art based upon the foregoing description of the process utilized in this invention.

Reference is now made to FIGS. 8A and 8B which illustrates device 10 in plan and side elevation without reference to the etch-stop layers. As shown in FIGS. 8A and 8B, taper 14A gradually decreases to extinction in the vertical plane while taper 14B in cladding layer 28 concurrently gradually increases laterally. Active section 12 is characterized by strong optical confinement in the vertical direction. Passive section 16 is characterized by weak optical confinement. As the light travels through vertical taper 14A, the optical confinement is reduced and the optical mode begins to expand because the waveguide becomes narrower in the vertical direction. The mode profiles, however, in the vertical and the lateral directions are not independent but rather are coupled. Thus, as the beam is expanding in the vertical direction due to taper 14A, the beam also has to expand in the lateral direction and lateral taper 14B accommodates this expansion permitting the larger mode. If the same lateral width was maintained as in active region section 12 in FIG. 8A, and extended along the entire laser cavity of device 10, the lateral confinement would be too strong and, as a result, the mode shape of the optical beam is distorted. Thus, lateral taper 14B insures a more stable optical mode.

The lateral taper 14B may be fabricated utilizing known photo-lithographic processes utilizing a laterally tapered photo-mask instead of a conventional straight line photo-mask.

The output beam profile from laser diode incorporating the tapered ridge waveguide structure of this invention is characterized by a smooth, Gaussian profile, as shown in FIG. 5A at 70. In ridge waveguide device 10, the output beam's far-field divergence was measured to be approximately 15° in both the lateral and vertical directions. Thus, the ridge waveguide laser diode device 10 according to this embodiment of the present invention provides a substantial improvement over a convention laser having a 40° divergence angle in the vertical direction, as illustrated previously in FIG. 5B at 72.

FIG. 9A illustrates a tapered DFB laser diode device 100 according to this invention. While similar in structure to the diode device previously described, tapered DFB laser diode device 100 further includes a grating layer 102. Grating layer 102, e.g., InGaAsP, is formed on active layer 24 and, as known in the art. A grating 104 is formed in layer 102 in active section prior to the deposition of cladding layer 28, as is known in the art. Grating 104 is a first order, periodic grating that diffracts light in the active layer 24 to produce optical feedback along the length of the laser cavity for a specific wavelength determined by the grating pitch. The feedback process selects the particular wavelength which oscillates in the laser cavity. Rear facet 106 is coated with a high reflection (HR) coating 107 so that light will not exit the back facet. Output facet 108 is coated with an anti-reflection (AR) coating 110 to provide for exit of the beam and to suppress the Fabry-Perot mode.

The processes utilized to form tapered DFB device 100 are similar to the processes described above in connection with device 10. The difference here is that grating layer 102 and the formation of grating 104 is accomplished before the regrowth process. Then, a p-cladding layer 28 is formed followed by a suitable contact layer 46. As shown in FIG. 9A, grating layer 102 can be grown in a separate designated regrowth step after the non-selective/selective taper etch steps have been performed according to this invention. In FIG. 9A, a grating layer 102 is grown after which a grating 104 is formed in section 12 of layer 102 with active waveguide layer 24 using, for example, conventional holographic techniques as is known in the art. After formation of grating 104, cladding layer 28 is grown followed by an appropriate contact layer. Preferably, however, grating layer 102 is grown as part of the base structure comprising layers 20, 22, 23, and 24, as shown in FIG. 9B for DFB laser device 120 which is identical to DFB laser device 100 in FIG. 9A except for the geometry of grating layer 102. After the growth of layer 24, grating layer 102, which is sandwiched between thin InP layers (not shown) on adjacent sides of the layer, is grown and its growth is followed by the deposition of plural sacrificial layers 50, 51 and 30 as shown in FIG. 4A. This is followed by the non-selective etching and selective etching steps to produce the flatten region 47 as well as refine the taper of waveguide layer 24. Next, grating 104 is formed in layer 102 as is known in the art, after which the regrowth process is initiated to form cladding layer 28 on grating layer 102 followed by an appropriate contact layer 46.

The resulting DFB device performs with a similar electrical-to-optical conversion efficiency as illustrated in FIG. 6. For example, as shown in FIG. 10A at curve 112, a tapered DFB laser 100 was produced an output power of 80 mW for a drive current of approximately 350 mA. More importantly, tapered DFB laser device 100 produce a true single frequency output as illustrated in FIG. 10B. The spectral output shown in FIG. 10B is characterized by a series of very small peaks, represented by spectral region 115. Each small peak corresponds to a separate longitudinal mode. The main peak 120 of the spectral output profile represents a greater than 40 dB side mode suppression ratio. FIGS. 10A and 10B, therefore, illustrate that true single frequency output has been achieved with the DFB laser according to the present invention.

The foregoing devices 10 and 100 have been explained in conjunction with the formation of a ridge waveguide structure. However, these devices can be made using other techniques known in the art to form a waveguide structure in the lateral direction, such as buried-heterostructures (BH). One such embodiment is shown in FIGS. 11A and 11B. Tapered laser device 130 comprises a device structure comprising active gain section 131, tapered section 133 and passive waveguide section 135, the layers of which may be conventionally fabricated employing MOCVD. Device 130 comprises substrate 132, such as InP, cladding layer 134, such as n-InP, passive waveguide layer 136, such as InGaAsP, active region 138, such as InGaAsP that includes an active region comprising an active layer or unstrained or strained single or multiple quantum well layers separated by barrier layers as is known in the art. Vertical taper 133A is formed by the method, as previously explained, comprising a non-selective/selective etch process. After taper 133A is formed, regrowth comprises cladding layer 140, such as p-InP, and contact layer 142, such as InGaAs. In order to form the lateral waveguiding property of the optical waveguide of device 130, a patterned etch followed by a regrowth of semi-insulating InP at 160 is performed, forming waveguide 162 which may have a lateral expansion for the mode through tapered section 133 as previously illustrated previously in FIG. 8A at 14B.

In FIG. 11A, the cross sectional profiles of the propagating mode are shown. In active gain section 131, the mode is elliptical in cross sectional shape as shown at 150. In tapered section 133, as the mode propagation progresses from left to right in the figure, the mode becomes larger, as shown at 152, as it expands at a faster rate along the vertical (short) axis of the profile than experienced along the lateral (long) axis of the profile. In passive waveguide section 135, the mode has become substantially circular as shown at 154. The exit of the light beam from facet 137 in the far field will have a substantially circular shape 155 whereas the exit from the beam from facet 139 in the far field will have a substantially elliptical shape 151.

While various embodiments of the present invention have been described above, it should be understood that they have been presented by way of example only, and not limitation. For example, the tapering may be formed at opposite ends of the device and not just at one end. Thus, the breadth and scope of the present invention should not be limited by any of the above-described exemplary embodiments, but should be defined only in accordance with the following claims and their equivalents.

What is claimed is:

1. A method of fabricating a laser diode device, comprising the steps of:
    forming a base structure comprising a plurality of semiconductor layers having a waveguide region that includes an active waveguide layer;
    performing a first etching on the base structure forming a vertical taper contour along the base structure including a portion of the active waveguide layer; and
    performing a second etching producing a planar waveguide region with a flat portion adjacent to the formed vertical taper of the first performed etching, the planar region providing a window region of a length within which a cleave can be performed to form a facet upon further completion of the device.

2. The method of claim 1 wherein the waveguide region includes a passive waveguide layer formed beneath the active waveguide layer, a further step comprising:
    forming a stop etch layer between the passive and active waveguide layers.

3. The method of claim 2 wherein the active and passive waveguide layers comprise InGaAsP and the etch-stop layer is InP.

4. The method of claim 1 comprising the further step of:
    forming a sacrificial layer over the base structure, the thickness of the sacrificial layer determinative of the depth of etching in the first performed etching.

5. The method of claim 4 comprising the further step of:
    determining a thickness of the sacrificial layer, $d^{sac}$, according to the relationship, $$r_{min} \cdot t < d^{sac} < r_{max} \cdot t - d^{taper}$$

where $r_{min}$ and $r_{max}$ respectively correspond to minimum and maximum etch rates along a direction of the vertical, t corresponds to total etching duration time, and $d^{taper}$ corresponds to a total thickness of the plurality of layers through which a vertical taper is formed.

6. The method of claim 1 wherein the first performed etching is a non-selective etching.

7. The method of claim 6 wherein said non-selective etching is a diffusion limited wet etching employing a bromine ($Br_2$)-based etchant.

8. The method of claim 1 wherein the first performed etching is applied via a masking layer having a tapered opening formed therein.

9. The method of claim 1 wherein the second performed etching is a selective etching.

10. The method of claim 9 wherein the selective etching comprises InGaAsP-based etchant.

11. The method of claim 1 further comprising the step of:
forming a stop etch layer between the active waveguide layer and layer therebeneath, the second performed etching further etching the active waveguide layer to the stop etch layer revealing a portion thereof, the length of which is the window region.

12. The method of claim 11 wherein the layer beneath the stop etch layer is a passive waveguide layer forming part of the waveguide region.

13. The method of claim 1 further comprising the steps of:
forming a first stop etch layer between the active waveguide layer and layer therebeneath utilized during the second performed etching;
forming multiple sacrificial layers over the base structure, one of said multiple sacrificial layers having a thickness determinative of the depth of etch performed by the first performed etching and another of said multiple sacrificial layers for providing a second etch-stop layer utilized during the second etching;
said second etching further comprising the steps of:
performing a first selective etching step for removing exposed portions of the first and second etch-stop layers exposed during the first performed etching; and
performing a second selective etching step for further etching the active waveguide layer to uncover a further portion of the first stop etch layer, the length of which is the window region.

14. The method of claim 13 wherein said first selective etching step forms a eye-mark for easy identification of one end of said window region.

15. The method of claim 13 wherein the waveguide region and the one multiple sacrificial layer are InGaAsP and the first and second etch-stop layers are InP.

16. The method of claim 15 wherein the non-selective etching is a diffusion limited wet etching employing a bromine ($Br_2$)-based etchant, the first selective etching step is InP-based etchant and the second selective etching step is InGaAsP-based etchant.

17. The method of claim 13 wherein the first performed etching is applied via a masking layer having a tapered opening formed therein.

18. The method of claim 13 wherein the first performed etching is a diffusion-limited etching step applied through a masking layer having a tapered opening formed therein.

19. The method of claim 1 wherein the waveguide region includes a passive waveguide layer formed beneath the active waveguide layer, a further comprising the step of:
forming the thickness of the passive waveguide layer to correspond to a desired resulting mode profile based upon adiabatic transformation of a mode propagating from the tapered active waveguide layer into the passive waveguide layer.

20. The method of claim 19 wherein said desired adiabatic transformed mode profile is substantially circular.

21. The method of claim 1 further comprising the step s of:
forming a transparent waveguide layer on the waveguide region as part of the base structure after performance of the etching steps; and
forming a grating in the transparent waveguide layer upon completion of the first and second performed etching over a remaining portion of the active waveguide layer.

22. The method of claim 21 further comprising the steps of:
forming a cladding layer on the transparent waveguide layer; and
forming a contact layer of the cladding layer.

23. The method of claim 1 further comprising the steps of:
forming a transparent waveguide layer on the waveguide region as part of the base structure prior to performance of the etching steps; and
forming a grating in the transparent waveguide layer upon completion of the first and second performed etching over a remaining portion of the active waveguide layer.

24. The method of claim 23 further comprising the steps of:
forming a cladding layer on the transparent waveguide layer; and
forming a contact layer of the cladding layer.

25. The method of claim 1 further comprising a regowth process after completion of the first and second performed etching comprising the steps of:
forming a cladding layer on the etched base structure; and
forming a contact layer of the cladding layer.

26. The method of claim 25 further comprising the step of:
forming a lateral taper region in the cladding layer spatially coincident with the formed vertical taper of the active waveguide layer.

* * * * *